(12) United States Patent
Lin

(10) Patent No.: US 12,407,310 B2
(45) Date of Patent: Sep. 2, 2025

(54) POWER EFFICIENT COMPLEMENTARY AMPLIFIER AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 437 days.

(21) Appl. No.: 18/182,439

(22) Filed: Mar. 13, 2023

(65) Prior Publication Data

US 2024/0313721 A1  Sep. 19, 2024

(51) Int. Cl.
*H03F 1/22* (2006.01)
*H03F 1/56* (2006.01)
*H03F 3/45* (2006.01)

(52) U.S. Cl.
CPC ......... *H03F 3/45188* (2013.01); *H03F 1/223* (2013.01); *H03F 1/565* (2013.01)

(58) Field of Classification Search
CPC ....................................................... H03F 1/22
USPC ....................................................... 330/311
See application file for complete search history.

(56) References Cited

U.S. PATENT DOCUMENTS 9,964,985 B1   5/2018   Leong
10,447,218 B1  10/2019  Xie

*Primary Examiner* — Henry Choe
(74) *Attorney, Agent, or Firm* — McClure, Qualey & Rodack, LLP

(57) ABSTRACT

A method operates by receiving an input signal; transforming the input signal into a first transformed signal of a common-mode voltage equal to a first bias voltage; transforming the input signal into a second transformed signal of a common-mode voltage equal to a second bias voltage; detecting a peak of the first transformed signal and making the first bias voltage equal to a sum of a first DC (direct current) voltage and a first dynamic voltage; detecting a valley of the second transformed signal and making the second bias voltage equal to a sum of a second DC voltage and a second dynamic voltage; amplifying the first transformed signal into a first output signal across a first load using a N-type cascode amplifier; and amplifying the second transformed signal into a second output signal across a second load using a P-type cascode amplifier.

20 Claims, 5 Drawing Sheets

POWER EFFICIENT COMPLEMENTARY AMPLIFIER AND METHOD THEREOF

BACKGROUND OF THE INVENTION

Field of the Invention

The present invention generally relates to amplifier and particularly to power efficient complementary amplifier.

Description of Related Art

A conventional common-source amplifier uses a NMOST (n-channel metal oxide semiconductor field-effect transistor) to fulfill an amplification function; the NMOST has a source (terminal), a gate (terminal), and a drain (terminal), wherein an input voltage is received at the gate, a ground node is connected to the source, and an output current is delivered from a drain to a load that establishes an output voltage in response to the output current in accordance with an impedance of the load. Ideally, an incremental change of the input voltage will result in a proportional incremental change of the output voltage, wherein a ratio of incremental changes between the output voltage and the input voltage is referred to as a gain. A linearity of the amplification function is gauged by how well the gain can sustain and maintain approximately the same value when an amplitude of the input voltage increases, and it depends on a bias condition. A conventional common-source amplifier biased in a deeper class-A region, wherein a quiescent bias current is higher, can have a better linearity, at a cost of a poorer power efficiency. To preserve a good power efficiency while maintaining a good linearity, a dynamic bias scheme is often used, wherein a bias condition is dynamically adjusted in accordance with an amplitude of the input voltage in a way that the common-source amplifier is biased in a deeper class-A region in the presence of an input voltage of a larger amplitude. A conventional common-source amplifier, however, often encounters issues of ground bounce and source degeneration due to a nonzero resistance of a physical connection between a source and a ground node. Concepts of "common-source amplifier," "bias," "class-A region," "power efficiency," "source degeneration," and "ground bounce" are well understood by those of ordinary skills in the art and thus not described in detail here.

In U.S. Pat. No. 10,447,218– B1, Xie, Leong, and Lin disclosed a complementary amplifier that uses both a NMOST and a PMOST (p-channel metal oxide semiconductor field-effect transistor) to form a hybrid differential pair that share a common source node, i.e., a source of the NMOST is directly connected to a source of the PMOST, so that the issues of ground bounce and source degeneration that conventional common-source amplifiers often encounter can be mitigated. Due to a difference in amplifier topology, however, a dynamic bias scheme used in a conventional common-source amplifier is no longer applicable to a complementary amplifier.

What is desired is a dynamic bias scheme for a complementary amplifier.

BRIEF SUMMARY OF THIS INVENTION

In an embodiment, an amplifier comprises: a transformer configured to transform an input signal received from a primary coil into a first transformed signal of a first bias voltage and a second transformed signal of a second bias voltage via a first secondary coil and a secondary coil, respectively; a N-type dynamic bias circuit configured to receive the first transformed signal and output the first bias voltage in accordance with a first DC (direct current) voltage and a peak of the first transformed signal; a P-type dynamic bias circuit configured to receive the second transformed signal and output the second bias voltage in accordance with a second DC voltage and a valley of the second transformed signal; a N-type cascode amplifier configured to receive the first transformed signal and output a first output signal across a first load; and a P-type cascode amplifier configured to receive the second transformed signal and output a second output signal across a second load, wherein: the N-type cascode amplifier and the P-type cascode amplifier share a common source node.

In an embodiment, a method comprises: receiving an input signal; transforming the input signal into a first transformed signal of a common-mode voltage equal to a first bias voltage; transforming the input signal into a second transformed signal of a common-mode voltage equal to a second bias voltage; detecting a peak of the first transformed signal and making the first bias voltage equal to a sum of a first DC (direct current) voltage and a first dynamic voltage approximately proportional to the peak; detecting a valley of the second transformed signal and making the second bias voltage equal to a sum of a second DC voltage and a second dynamic voltage approximately proportional to the valley; amplifying the first transformed signal into a first output signal across a first load using a N-type cascode amplifier; and amplifying the second transformed signal into a second output signal across a second load using a P-type cascode amplifier, wherein the N-type cascode amplifier and the P-type amplifier share a common source node.

DETAILED DESCRIPTION OF THIS INVENTION

Figure 1:
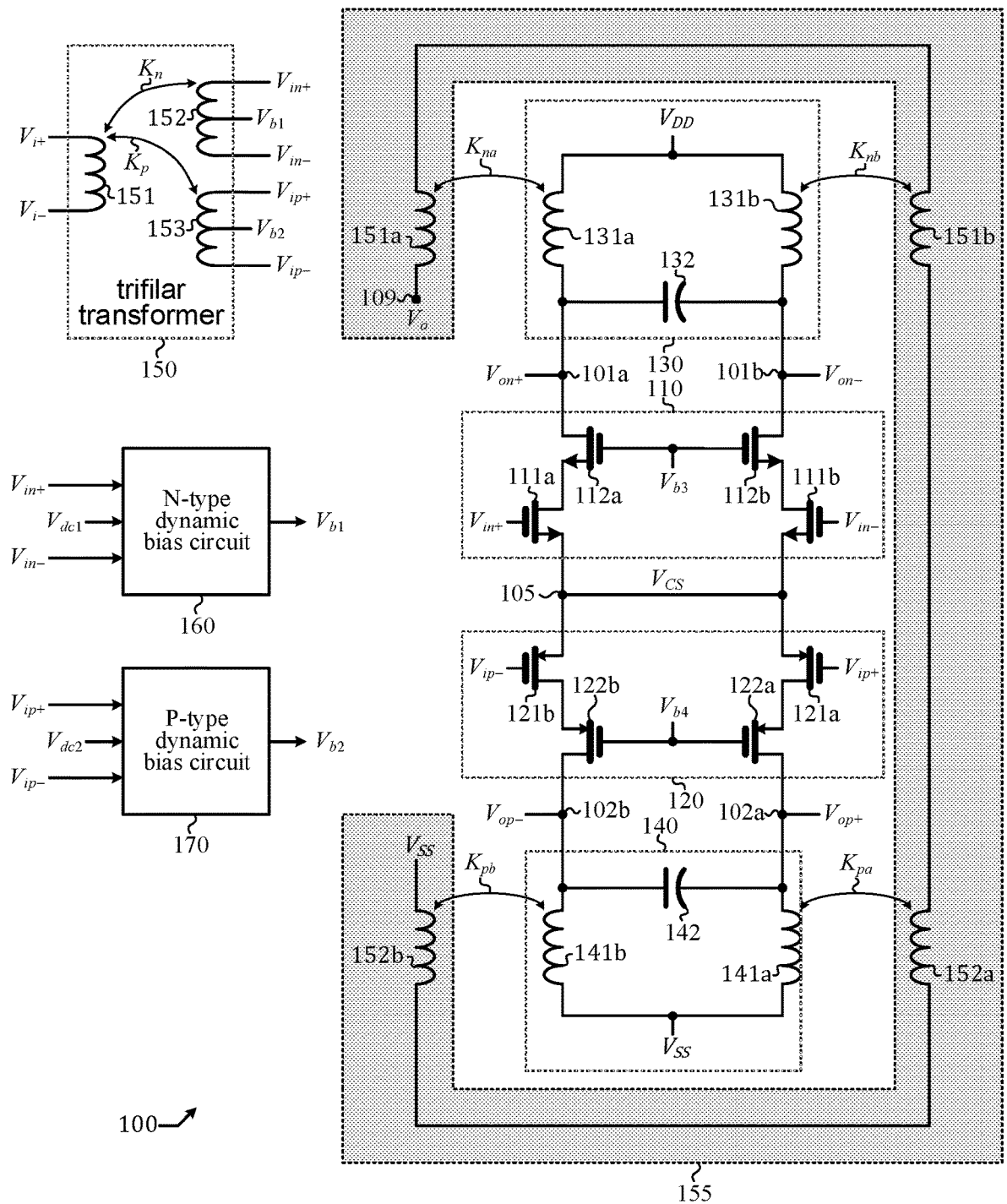
FIG. 1 shows a schematic diagram of an amplifier in accordance with an embodiment of the present invention.

The present invention relates to amplifiers. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Persons of ordinary skill in the art understand terms and basic concepts related to microelectronics that are used in this disclosure, such as "voltage," "current," "signal," "differential signal," "common mode," "capacitor," "inductor," "resistor," "transistor," "MOST (metal-oxide semiconductor field-effect transistor)," "PMOST (p-channel metal oxide semiconductor field-effect transistor)," "NMOST (n-channel metal oxide semiconductor field-effect transistor)," "AC (alternating current)," "DC (direct current)," "DC coupled," "AC coupled," "source," "gate," "drain," "node," "ground node," "power supply node," "cascode," "common-source amplifier," "common-gate amplifier," "load," "impedance," and "cascode amplifier." Those of ordinary skill in the art can also readily recognize a symbol of a MOST (metal-oxide semiconductor field effect transistor), and its associated "source," "gate," and "drain" terminals. Terms and basic concepts like these are understood by those of ordinary skill in the art and thus will not be explained in detail here.

Persons of ordinary skill in the art can recognize a resistor symbol, a capacitor symbol, an inductor symbol, and a MOST (metal-oxide semiconductor field effect transistor) symbol, for both PMOST (p-channel metal-oxide semiconductor field effect transistor) and NMOST (n-channel metal-oxide semiconductor field effect transistor), and can identify a "source" terminal, a "gate" terminal, and a "drain" terminal of a MOST. For brevity, in this present disclosure, in a context of referring to a MOST, a "source terminal" is simply referred to as "source," a "gate terminal" is simply referred to as "gate," and a "drain terminal" is simply referred to as "drain."

Those of ordinary skill in the art can read schematics of a circuit comprising resistors, capacitors, inductors, NMOST, and PMOST, and do not need a verbose description about how one transistor, resistor, inductor, or capacitor connects with another in the schematics.

Throughout this disclosure, "DC" stands for direct current, and "AC" stands for alternating current. A DC node is a node of a substantially fixed electric potential. In particular, "$V_{DD}$" denotes a first DC node referred to as a power node, and "$V_{SS}$" denotes a second DC node referred to as a ground node. A DC voltage refers to a substantially stationary voltage. An AC voltage refers to a voltage that varies with time in an oscillatory manner and is also referred to as a dynamic voltage.

A common-source amplifier is embodied by a MOST configured to receive an input voltage form a gate and output an output current via a drain, wherein a source is connected to a DC node. A common-source amplifier embodied by a NMOST (PMOST) is referred to an N-type (P-type) common-source amplifier.

A common-gate amplifier is embodied by a MOST configured to receive an input current from a source and output an output current via a drain, wherein a gate is connected to a DC node. A common-gate amplifier embodied by a NMOST (PMOST) is referred to as an N-type (P-type) common-gate amplifier.

A cascode amplifier is a cascade of a common-source amplifier and a common-gate amplifier of the same type, wherein an output current of the common-source amplifier is an input current of the common-gate amplifier. A cascode amplifier embodied by NMOST (PMOST) is referred to as a N-type (P-type) cascode amplifier.

A source follower is embodied by a MOST configured to receive an input voltage at a gate and output an output voltage at a source, wherein a drain connects to a DC node or a circuit node of a sufficiently low impedance. A source follower embodied by a NMOST (PMOST) is referred to as a N-type (P-type) source follower.

A circuit is a collection of a transistor, a capacitor, an inductor, a resistor, and/or other electronic devices interconnected in a certain manner to embody a certain function. A network is a circuit or a collection of circuits configured to embody a certain function.

In this present disclosure, a "circuit node" is simply referred to as a "node" for short, as the meaning is clear from a context of microelectronics won't cause confusion.

In this present disclosure, a signal is a voltage of a variable level that can vary with time. A (voltage) level of a signal at a moment represents a state of the signal at that moment. A differential signal, or a signal in a differential embodiment, comprises a first voltage denoted with a subscript appended with "+" and a second voltage denoted with a subscript appended with "−." For instance, signal $V_i$ ($V_{in}$, $V_{ip}$, $V_{op}$, $V_{on}$) comprises $V_{i+}$ ($V_{in+}$, $V_{ip+}$, $V_{op+}$, $V_{on+}$) and $V_{i-}$ ($V_{in-}$, $V_{ip-}$, $V_{op-}$, $V_{on-}$). A difference in level between the first voltage and the second voltage represents a state of the differential signal.

A schematic diagram of an amplifier 100 in accordance with an embodiment of the present disclosure is shown in FIG. 1. Amplifier 100 comprises: a trifilar transformer 150 configured to receive an input signal $V_i$ (which comprises two voltages $V_{i+}$ and $V_{i-}$ in a differential embodiment) and output a first transformed signal $V_{in}$ (which comprises two voltages $V_{in+}$ and $V_{in-}$ in a differential embodiment) and a second transformed signal $V_{ip}$ (which comprises two voltages $V_{ip+}$ and $V_{ip-}$ in a differential embodiment) in accordance with a first bias voltage $V_{b1}$ and a second bias voltage $V_{b2}$, respectively; a N-type dynamic bias circuit 160 configured to receive the first transformed signal $V_{in}$ (comprising $V_{in+}$ and $V_{in-}$) and output the first bias voltage $V_{b1}$ in accordance with a first DC (direct current) voltage $V_{dc1}$; a P-type dynamic bias circuit 170 configured to receive the second transformed signal $V_{ip}$ (comprising $V_{ip+}$ and $V_{ip-}$) and output the second bias voltage $V_{b2}$ in accordance with a second DC voltage $V_{dc2}$; a N-type cascode amplifier 110 configured to receive the first transformed signal $V_{in}$ (comprising $V_{in+}$ and $V_{in-}$) and output a first output signal $V_{on}$ (which comprises two voltages $V_{on+}$ and $V_{on-}$ in a differential embodiment) across a first load 130 in accordance with a third bias voltage $V_{b3}$; and a P-type cascode amplifier 120 configured to receive the second transformed signal $V_{ip}$ (comprising $V_{ip+}$ and $V_{ip-}$) and output a second output signal $V_{op}$ (which comprises two voltages $V_{op+}$ and $V_{op-}$ in a differential embodiment) across a second load 140 in accordance with a fourth bias voltage $V_{b4}$. As mentioned earlier, throughout this disclosure, "$V_{DD}$" denotes a power supply node, and "$V_{SS}$" denotes a ground node.

Trifilar transformer 150 comprises a primary coil 151, a first secondary coil 152, and a second secondary coil 153. A first magnetic coupling $K_n$ between the primary coil 151 and the first secondary coil 152 transforms $V_{i+}$ and $V_{i-}$ into $V_{in+}$ and $V_{in-}$, wherein a common-mode voltage of $V_{in+}$ and $V_{in-}$ is equal to $V_{b1}$ that is provided at a center-tap of the first secondary coil 152. A second magnetic coupling $K_p$ between the primary coil 151 and the second secondary coil 153 transforms $V_{i+}$ and $V_{i-}$ into $V_{ip+}$ and $V_{ip-}$, wherein a common-mode voltage of $V_{ip+}$ and $V_{ip-}$ is equal to $V_{b2}$ that is provided at a center-tap of the second secondary coil 153.

Figure 2:
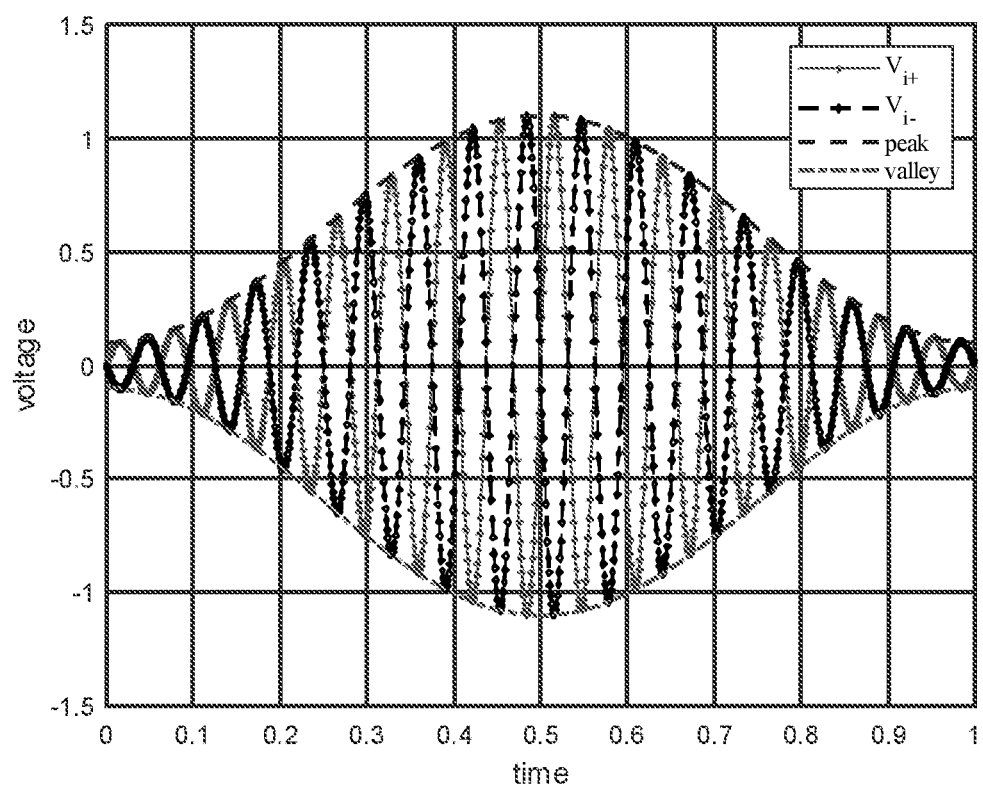
FIG. 2 shows an exemplary waveform of an input signal.

In an embodiment, the input signal $V_i$ (comprising $V_{i+}$ and $V_{i-}$) is a RF (radio frequency) signal of an amplitude that may vary with time. An exemplary waveform of $V_{i+}$ and $V_{i-}$ is shown in FIG. 2. As shown, $V_{i+}$ and $V_{i-}$ are of the same waveform but opposite in polarity, and both are oscillatory (i.e., sinusoidal) and bounded between a peak and a valley. Mathematically, $V_{i+}$ and $V_{i-}$ can be modeled as follows:

$$V_{i+} = A(t)\sin(\omega t + \varphi(t)) \quad (1)$$

$$V_{i-} = -A(t)\sin(\omega t + \varphi(t)) \quad (2)$$

Here, ω denotes an angular frequency, t denotes a time variable, A(t) denotes an amplitude function of time, φ(t) denotes a phase function of time. Note that A(t) and −A(t) represent the peak and the valley of the input signal $V_i$, respectively.

$V_{in+}$ and $V_{in-}$ can be modeled as follows:

$$V_{in+} = V_{b1} + \alpha_n A(t)\sin(\omega t + \varphi(t) + \theta_n(t)) \quad (3)$$

$$V_{in-} = V_{b1} - \alpha_n A(t)\sin(\omega t + \varphi(t) + \theta_n(t)) \quad (4)$$

Here, αn denotes a voltage-scaling factor depending on a turn ratio between the primary coil 151 and the first secondary coil 152, and $\theta_n(t)$ denotes a phase shift caused by the magnetic coupling $K_n$ between the primary coil 151 and the first secondary coil 152.

Likewise, $V_{ip+}$ and $V_{ip-}$ can be modeled as follows:

$$V_{ip+} = V_{b2} + \alpha_p A(t)\sin(\omega t + \varphi(t) + \theta_p(t)) \quad (3)$$

$$V_{ip-} = V_{b2} - \alpha_p A(t)\sin(\omega t + \varphi(t) + \theta_p(t)) \quad (4)$$

Here, $\alpha_p$ denotes a voltage-scaling factor depending on a turn ratio between the primary coil 151 and the second secondary coil 153, and $\theta_p(t)$ denotes a phase shift caused by the magnetic coupling $K_p$ between the primary coil 151 and the second secondary coil 153.

In an embodiment, an is approximately equal to $\alpha_p$, while $\theta_n(t)$ is approximately the same as $\theta_p(t)$.

N-type dynamic bias circuit 160 detects a peak of $V_{in+}$ and $V_{in-}$ and outputs $V_{b1}$ such that $V_{b1}$ is equal to $V_{dc1}$ plus a dynamical voltage that is proportional to A(t), that is:

$$V_{b1} + V_{dc1} + \alpha_n \beta_n A(t) \quad (5)$$

Here, $\beta_n$ denotes a gain factor of the N-type dynamic bias circuit 160.

Likewise, P-type dynamic bias circuit 170 detects a valley of $V_{ip+}$ and $V_{ip-}$ and outputs $V_{b2}$ such that $V_{b2}$ is equal to $V_{dc2}$ plus a dynamical voltage that is proportional to −A(t), that is:

$$V_{b2} + V_{dc2} + \alpha_p \beta_p A(t) \quad (6)$$

Here, $\beta_p$ denotes a gain factor of the P-type dynamic bias circuit 170.

In an embodiment, $\beta_n$ is approximately equal to $\beta_p$.

Figure 3:
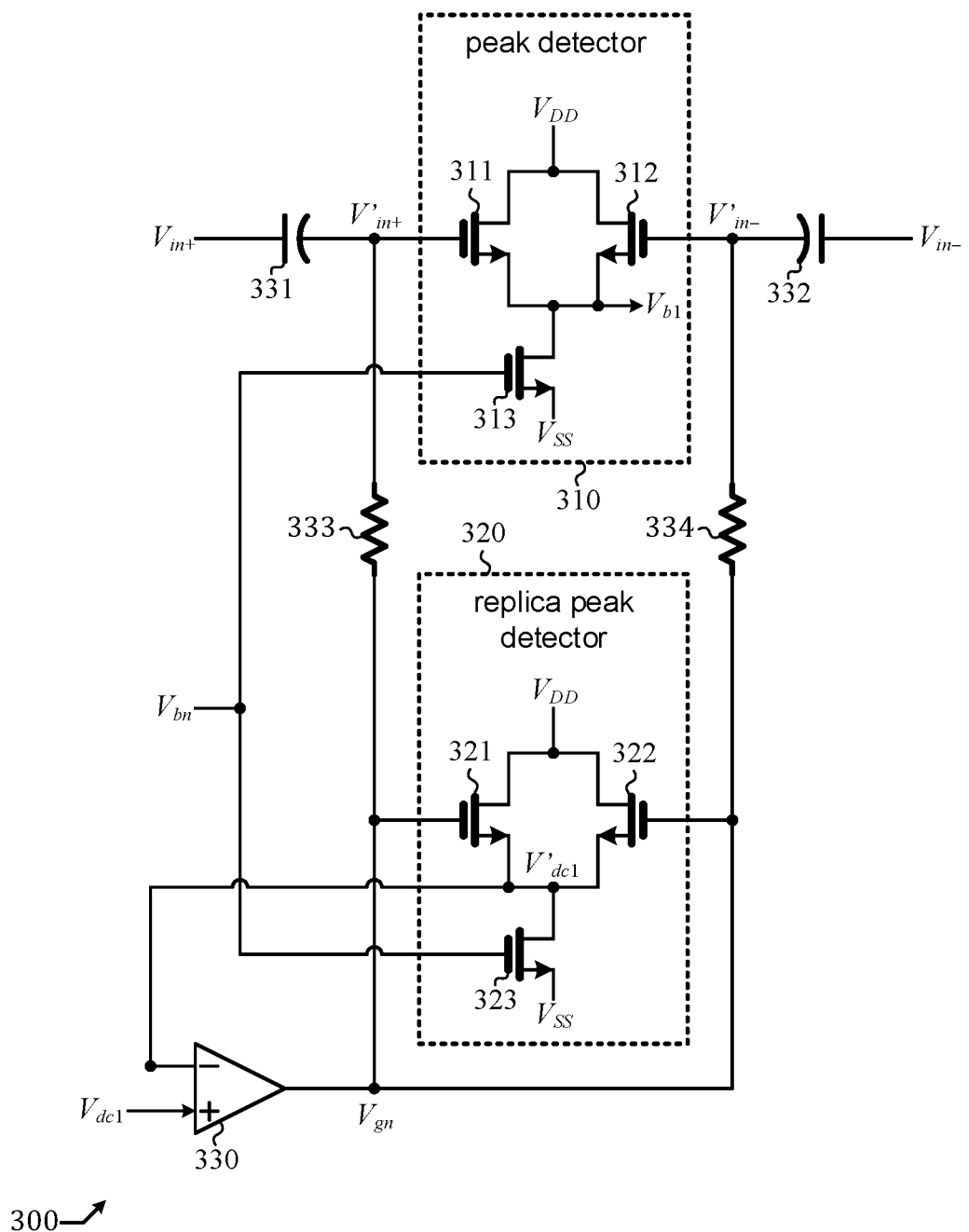
FIG. 3 shows a schematic diagram of a N-type dynamic bias circuit in accordance with an embodiment of the present disclosure.

A schematic diagram of an N-type dynamic bias circuit 300 that can be used to embody the N-type dynamic bias circuit 160 is shown in FIG. 3. N-type dynamic bias circuit 300 comprises: two AC (alternating current) coupling capacitors 331 and 332; two DC (direct current) coupling resistors 333 and 334; a peak detector 310 comprising three NMOST 311, 312, and 313; a replica peak detector comprising three NMOST 321, 322, and 323; and an operational amplifier 330. The peak detector 310 receives two voltages $V'_{in+}$ and $V'_{in-}$ that are AC coupled to $V_{in+}$ and $V_{in-}$ via the two AC coupling capacitors 331 and 332, respectively, wherein a DC level of $V'_{in+}$ and $V'_{in-}$ is set to a gate voltage $V_{gn}$ via the two DC coupling resistors 333 and 334, respectively. NMOST 311 and 312 are both configured as a source follower that receive $V'_{in+}$ and $V'_{in-}$, respectively, and jointly output $V_{b1}$ in accordance with a bias current provided by NMOST 313 that is configured as a current source controlled by a bias voltage $V_{on}$. $V_{b1}$ will follow whichever is higher between $V'_{in+}$ and $V'_{in-}$, thus fulfilling a peak detection function. The replica peak detector 320 has the same circuit topology as the peak detector 310. NMOST 321 and 322 are both configured as a source follower that receive Van and jointly output a replica DC voltage $V'_{dc1}$ in accordance with a bias current provided by NMOST 323 that is configured as a current source controlled by the bias voltage $V_{bn}$. The operational amplifier 330 outputs the gate voltage $V_{gn}$ in accordance with a difference between $V_{dc1}$ and $V'_{dc1}$. The operational amplifier 330 and NMOST 321 and 322 form a negative feedback control loop to make $V'_{dc1}$ approximately equal to $V_{dc1}$. Since the replica peak detector 320 is a replica of the peak detector 310, a DC level of $V_{b1}$ will be approximately equal to $V'_{dc1}$ and thus approximately equal to $V_{dc1}$ when $V_{in+}$ and $V_{in-}$ are quiescent (i.e., A(t)=0). When $V_{in+}$ and $V_{in-}$ are dynamic (i.e., A(t)≠0), an AC component of $V_{in+}$ and $V_{in-}$ will be coupled to $V'_{in+}$ and $V'_{in-}$, and a peak is detected and added to $V_{b1}$ on top of $V_{dc1}$, thus fulfilling the function described by equation (5). Operational amplifiers are well known in the prior art and thus not described in detail here. The operational amplifier 330 can be implemented using a variety of circuits known in the prior art at a discretion of circuit designer.

Figure 4:
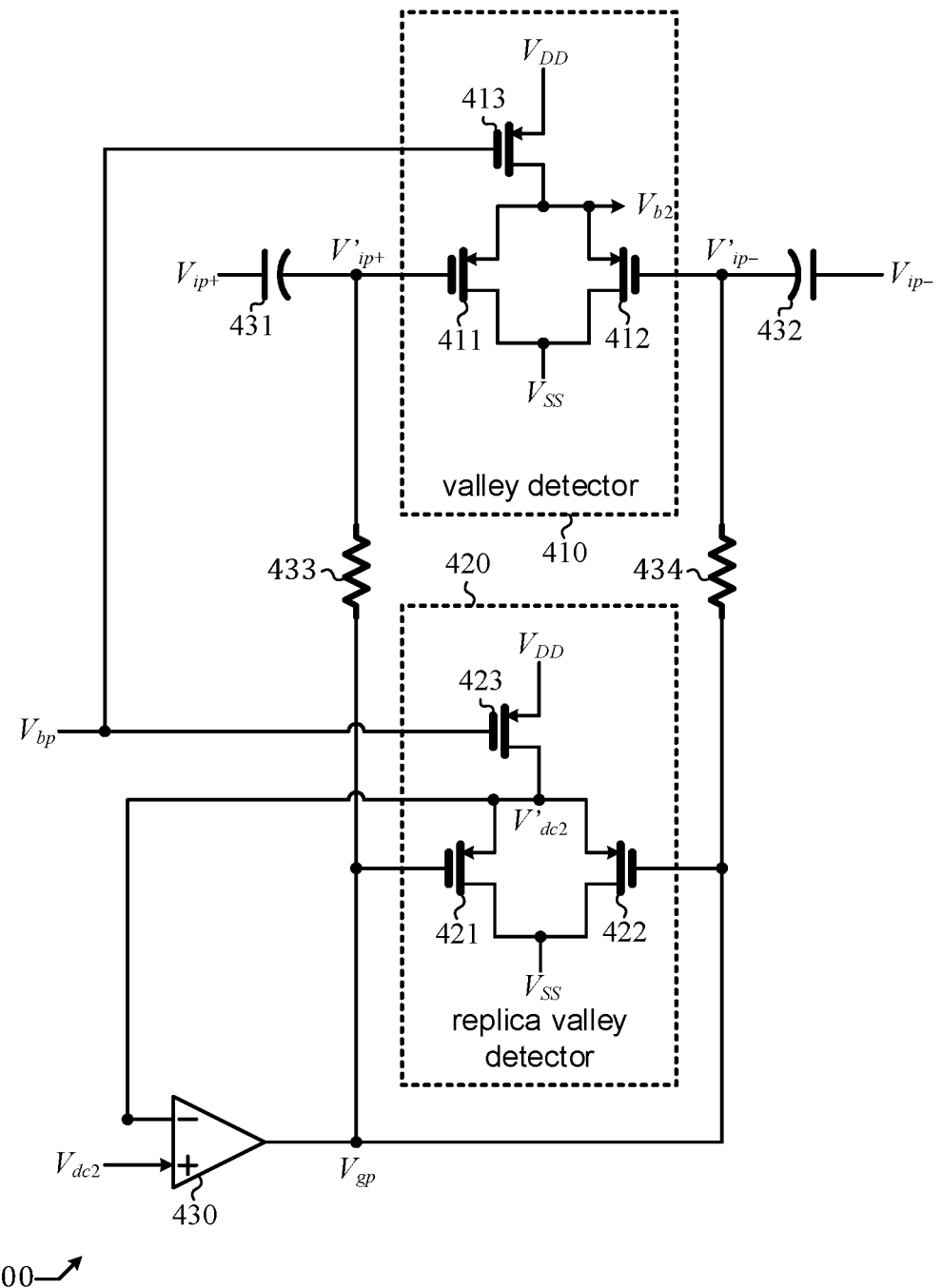
FIG. 4 shows a schematic diagram of a P-type dynamic bias circuit in accordance with an embodiment of the present disclosure.

A schematic diagram of a P-type dynamic bias circuit 400 that can be used to embody the P-type dynamic bias circuit 170 is shown in FIG. 4. P-type dynamic bias circuit 400 comprises: two AC (alternating current) coupling capacitors 431 and 432; two DC (direct current) coupling resistors 433 and 434; a valley detector 410 comprising three PMOST 411, 412, and 413; a replica valley detector 420 comprising three PMOST 421, 422, and 423; and an operational amplifier 430. The valley detector 410 receives two voltages $V'_{ip+}$ and $V'_{ip-}$ that are AC coupled to $V_{ip+}$ and $V_{ip-}$ via the two AC coupling capacitors 431 and 432, respectively, wherein a DC (direct current) level of $V'_{ip+}$ and $V'_{ip-}$ is set to be equal to a gate voltage $V_{gp}$ via the two DC coupling resistors 433 and 434, respectively. PMOST 411 and 412 are both configured as a source follower that receive $V'_{ip+}$ and $V'_{ip-}$, respectively, and jointly output $V_{b2}$ in accordance with a bias current provided by PMOST 413 that is configured as a current source controlled by a bias voltage $V_{bp}$. $V_{b2}$ will follow whichever is lower between $V'_{ip+}$ and $V'_{ip-}$, thus fulfilling a valley detection function. The replica valley detector 420 has the same circuit topology as the valley detector 410. PMOST 421 and 422 are both configured as a source follower that receive $V_{gp}$ and jointly output a replica DC voltage $V'_{dc2}$ in accordance with a bias current provided by PMOST 423 that is configured as a current source controlled by the bias voltage $V_{bp}$. The operational amplifier 430 outputs the gate voltage $V_{gp}$ in accordance with a difference between $V_{dc2}$ and $V'_{dc2}$. The operational amplifier 430 and PMOST 421 and 422 form a negative feedback control loop to make $V'_{dc2}$ approximately equal to $V_{dc2}$. Since the replica valley detector 420 is a replica of the valley detector 410, a DC level of $V_{b2}$ will be approximately equal to $V'_{dc2}$ and thus approximately equal to $V_{dc2}$ when $V_{ip+}$ and $V_{ip-}$ are quiescent (i.e., A(t)=0). When $V_{ip+}$ and $V_{ip-}$ are dynamic (i.e., A(t)+0), an AC component of $V_{ip+}$ and $V_{ip-}$ will be coupled to $V'_{ip+}$ and $V'_{ip-}$, and a valley is detected and added to $V_{b2}$ on top of $V_{dc2}$, thus fulfilling the function described by equation (6).

Note that a circuit principle of the P-type dynamic bias circuit 400 is the same as the N-type dynamic bias circuit 300, except that peak detection is replaced by valley detection, $V_{dc1}$ is replaced by $V_{dc2}$, $V'_{dc1}$ is replaced by $V'_{dc2}$, and $V_{b1}$ is replaced by $V_{b2}$. Note that a NMOST is turned on when a gate voltage is high, while a PMOST is turned on when a gate voltage is low. That is why a NMOST can be used to detect a peak voltage, while a PMOST can be used to detect a valley voltage.

Now reference is made to FIG. 1. The N-type cascode amplifier 110 comprises NMOST 111a and 111b configured as a common-source amplifier, and NMOST 112a and 112b biased by $V_{b3}$ and configured as a common-gate amplifier to establish a high output impedance and provide a high reverse isolation.

P-type cascode amplifier 120 comprises PMOST 121a and 121b configured as a common-source amplifier, and PMOST 122a and 122b biased by $V_{b4}$ and configured as a common-gate amplifier to establish a high output impedance and provide a high reverse isolation.

A source of the N-type cascode amplifier 110 connects to a source of the P-type cascode amplifier 120 at a common source node 105. This way, NMOST 111a and PMOST 121b form a first hybrid differential pair configured to receive and amplify a first hybrid differential signal comprising $V_{in+}$ and $V_{ip-}$, while NMOST 111b and PMOST 121a form a second hybrid differential pair configured to receive and amplify a second hybrid differential signal comprising $V_{in-}$ and $V_{ip+}$. Issues of ground bounce and source degeneration are mitigated, as explained in U.S. Pat. No. 10,447,218– B1. When the N-type cascode amplifier 110 and the P-type cascode amplifier 120 have approximately the same transconductance (i.e., voltage-to-current conversion ratio), and the first load 130 and the second load 140 have approximately the same impedance, a voltage $V_{CS}$ at the common source node 105 is substantially stationary, an AC component of $V_{on+}$ at node 101a will be approximately equal to an AC component of $V_{op+}$ at node 102a, while an AC component of $V_{on-}$ at node 101b will be approximately equal to an AC component of $V_{op-}$ at node 102b. In a further embodiment not shown in FIG. 1, two additional capacitors are added, one placed across nodes 101a and 102a to enforce $V_{in+}$ and $V_{ip+}$ having an approximately equal AC component, and the other placed across nodes 101b and 102b to enforce $V_{in-}$ and $V_{ip-}$ having an approximately equal AC component.

When an amplitude of $V_{i+}$ and $V_{i-}$ becomes larger, a peak of $V_{in+}$ and $V_{in-}$ rises and a valley of $V_{ip+}$ and $V_{ip-}$ falls; the N-type dynamic bias circuit 160 raises the first bias voltage $V_{b1}$, causing a common-mode voltage of $V_{in+}$ and $V_{in-}$ to rise and the N-type cascode amplifier 110 to be biased deeper into a class-A region; the P-type dynamic bias circuit 170 lowers the second bias voltage $V_{b2}$, causing a common-mode voltage of $V_{ip+}$ and $V_{ip-}$ to fall and the P-type cascode amplifier 120 to be biased deeper into a class-A region. This way, the N-type cascode amplifier 110 and the P-type cascode amplifier 120 can both be power efficient.

The first load 130 comprises two inductors 131a and 131b and a capacitor 132 configured to form a resonant network to have a high impedance to allow the N-type cascode amplifier 110 to provide a high voltage gain, while providing a DC path to the power supply node $V_{DD}$. The second load 140 comprises two inductors 141a and 141b and a capacitor 142 configured to form a resonant network to have a high impedance to allow the P-type cascode amplifier 120 to provide a high voltage gain, while providing a DC path to the ground node $V_{SS}$. Note that capacitors 132 and 142 are optional, as a parasitic capacitance at nodes 101a, 101b, 102a, and 102b might be sufficient to form a resonance with inductors 131a, 131b, 141a, and 141b.

In an alternative embodiment, capacitor 132 is placed across nodes 101a and 102b (instead of across nodes 101a and 101b as shown in FIG. 1), while capacitor 142 is placed across nodes 102a and 101b (instead of across nodes 102a and 102b as shown in FIG. 1). This alternative embodiment is workable because, as mentioned earlier, $V_{in+}$ and $V_{ip+}$ have approximately equal AC components, while $V_{in-}$ and $V_{ip-}$ have approximately equal AC components.

In a further embodiment, amplifier 100 further comprises an output combiner 155 comprising four additional inductors 151a, 151b, 152a, and 152b configured to be magnetically coupled to inductors 131a, 131b, 141a, and 141b with coupling coefficients $K_{na}$, $K_{nb}$, $K_{pa}$, and $K_{pb}$, respectively, while the four additional inductors are connected in series and placed across an output node 109 and the ground node $V_{SS}$. A combined output signal $V_o$ can be tapped from an output node 109. A load circuit can be placed across the output node 109 and the ground node $V_{SS}$.

In the appended claims, the two capacitors 331 and 332 and the two resistors 333 and 334 are described as an AC coupling network that couples $V_{in}$ (comprising $V_{in+}$ and $V_{in-}$) to $V'_{in}$ (comprising $V'_{in+}$ and $V'_{in-}$) while setting a DC voltage of $V'_{in}$ (comprising $V'_{in+}$ and $V'_{in-}$) to $V_{gn}$; NMOST 311 and NMOST 312 are referred to as a N-type common-mode source follower; and NMOST 321 and 322 are referred to as a replica N-type common-source follower. Likewise, the two capacitors 431 and 432 and the two resistors 433 and 434 are described as an AC coupling network that couples $V_{ip}$ (comprising $V_{ip+}$ and $V_{ip-}$) to $V'_{ip}$ (comprising $V'_{ip+}$ and $V'_{ip-}$) while setting a DC voltage of $V'_{ip}$ (comprising $V'_{ip+}$ and $V'_{ip-}$) to $V_{gp}$; PMOST 411 and PMOST 412 are referred to as a P-type common-mode source follower; and PMOST 421 and 422 are referred to as a replica P-type common-source follower.

In FIG. 1, the trifilar transformer 150 is used to transform $V_i$ (comprising $V_{i+}$ and $V_{i-}$) to $V_{in}$ (comprising $V_{in+}$ and $V_{in-}$) and $V_{ip}$ (comprising $V_{ip+}$ and $V_{ip-}$). However, this is just an example but not limitation. In an alternative embodiment, two bifilar transformers are used: one for transforming $V_i$ (comprising $V_{i+}$ and $V_{i-}$) to $V_{in}$ (comprising $V_{in+}$ and $V_{in-}$), and the other for transforming $V_i$ (comprising $V_{i+}$ and $V_{i-}$) to $V_{ip}$ (comprising $V_{ip+}$ and $V_{ip-}$). This should be obvious to those of ordinary skills in the art and thus not described in detail. Therefore, in the appended claims, a general term "transformer" is used without specifying a topology of the transformer; it is stated that the transformer comprises a primary coil, a first secondary coil, and a second secondary coil, and the statement is applicable to both the trifilar transformer 150 and the two bifilar transformers topologies.

Figure 5:
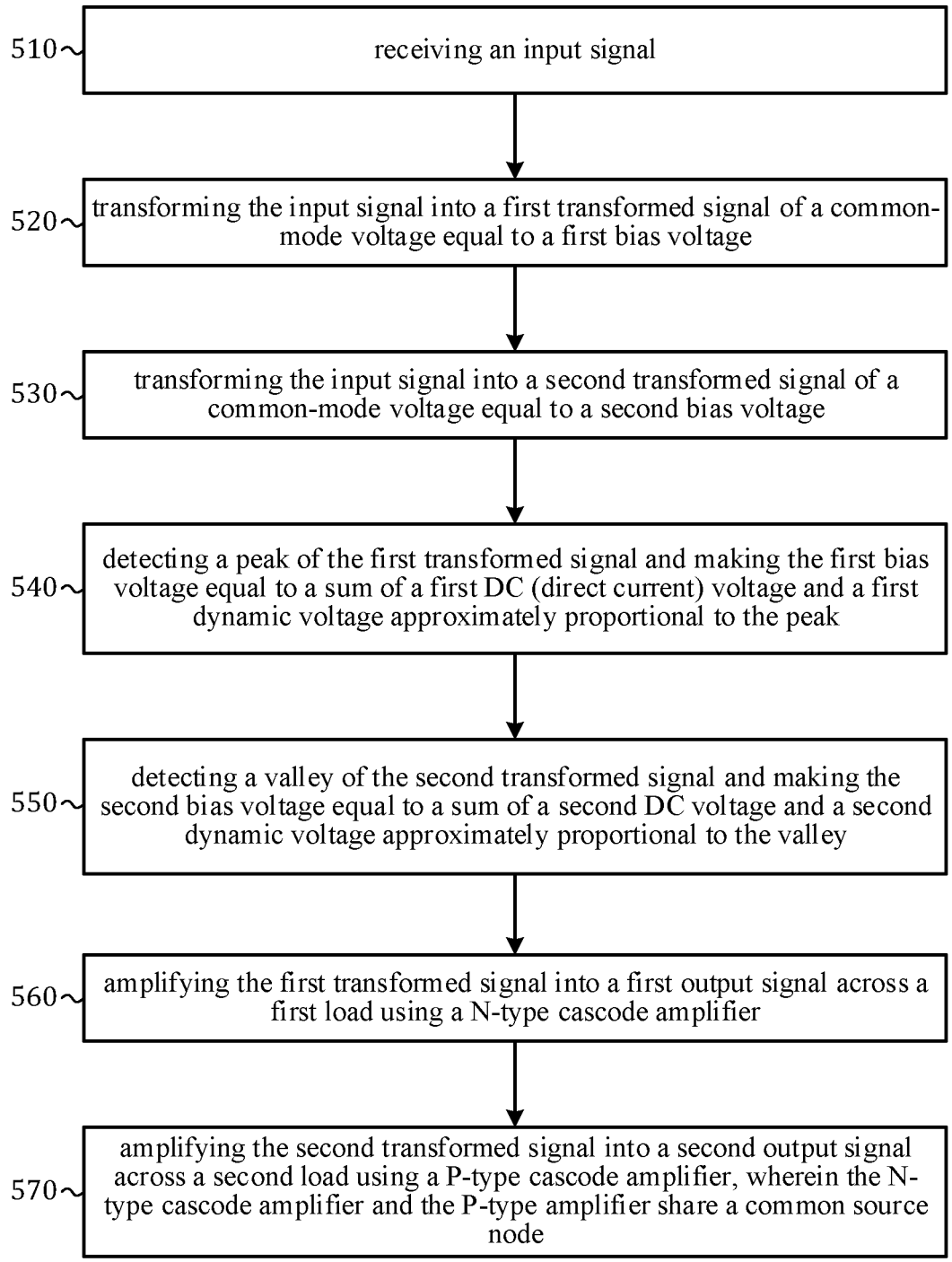
FIG. 5 shows a flow diagram of a method in accordance with the present invention.

As shown in a flow diagram shown in FIG. 5, a method in accordance with an embodiment of the present disclosure comprises: (step 510) receiving an input signal; (step 520) transforming the input signal into a first transformed signal of a common-mode voltage equal to a first bias voltage; (step 530) transforming the input signal into a second transformed signal of a common-mode voltage equal to a second bias voltage; (step 540) detecting a peak of the first transformed signal and making the first bias voltage equal to a sum of a first DC (direct current) voltage and a first dynamic voltage approximately proportional to the peak; (step 550) detecting a valley of the second transformed signal and making the second bias voltage equal to a sum of a second DC voltage and a second dynamic voltage approximately proportional to the valley; (step 560) amplifying the first transformed signal into a first output signal across a first load using a N-type cascode amplifier; and (step 570) amplifying the second transformed signal into a second output signal across a second load using a P-type cascode amplifier, wherein the N-type cascode amplifier and the P-type amplifier share a common source node.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. An amplifier comprising:
   a transformer configured to transform an input signal received from a primary coil into a first transformed signal of a first bias voltage and a second transformed signal of a second bias voltage via a first secondary coil and a secondary coil, respectively;
   a N-type dynamic bias circuit configured to receive the first transformed signal and output the first bias voltage in accordance with a first DC (direct current) voltage and a peak of the first transformed signal;
   a P-type dynamic bias circuit configured to receive the second transformed signal and output the second bias voltage in accordance with a second DC voltage and a valley of the second transformed signal;
   a N-type cascode amplifier configured to receive the first transformed signal and output a first output signal across a first load; and
   a P-type cascode amplifier configured to receive the second transformed signal and output a second output signal across a second load, wherein: the N-type cascode amplifier and the P-type cascode amplifier share a common source node.

2. The amplifier of claim 1, wherein the first bias voltage is provided to a center-tap of the first secondary coil, while the second bias voltage is provided to a center-tap of the second secondary coil.

3. The amplifier of claim 2, wherein the first bias voltage is equal to a sum of the first DC voltage and a dynamic voltage approximately proportional to a peak of the first transformed signal, while the second bias voltage is equal to a sum of the second DC voltage and a dynamic voltage approximately proportional to a valley of the second transformed signal.

4. The amplifier of claim 3, wherein: the N-type dynamic bias circuit comprises: an AC (alternating current) coupling network, a peak detector, a replica peak detector, and an operational amplifier, wherein: the AC coupling network couples the first transformed signal into a coupled signal of a DC voltage equal to a gate voltage, the peak detector comprises a N-type common-mode source follower configured to receive the coupled signal and output the first bias voltage, the replica peak detector comprises a replica N-type common-mode source follower configured to receive the gate voltage and output a replica DC voltage, and the operational amplifier outputs the gate voltage in accordance with a difference between the first DC voltage and the replica DC voltage.

5. The amplifier of claim 4, the operational amplifier and the replica N-type common-mode source follower form a negative feedback control loop to make the replica DC voltage approximately equal to the first DC voltage.

6. The amplifier of claim 3, wherein: the P-type dynamic bias circuit comprises: an AC (alternating current) coupling network, a valley detector, a replica valley detector, and an operational amplifier, wherein: the AC coupling network couples the second transformed signal into a coupled signal of a DC voltage equal to a gate voltage, the valley detector comprises a P-type common-mode source follower configured to receive the coupled signal and output the second bias voltage, the replica valley detector comprises a replica P-type common-mode source follower configured to receive the gate voltage and output a replica DC voltage, and the operational amplifier outputs the gate voltage in accordance with a difference between the second DC voltage and the replica DC voltage.

7. The amplifier of claim 6, the operational amplifier and the replica P-type common-mode source follower form a negative feedback control loop to make the replica DC voltage approximately equal to the second DC voltage.

8. The amplifier of claim 3, wherein: the N-type cascode amplifier comprises a cascade of a N-type common-source amplifier comprising a first NMOST (n-channel metal oxide semiconductor field effect transistor) and a N-type common-gate amplifier comprising a second NMOST, the first NMOST receiving the first transformed signal, and the second NMOST receiving a current output from the first NMOST and establishing the first output signal across the first load in accordance with a third bias voltage; and the P-type cascode amplifier comprises a cascade of a P-type common-source amplifier comprising a first PMOST (p-channel metal oxide semiconductor field effect transistor) and a P-type common-gate amplifier comprising a second PMOST, the first PMOST receiving the second transformed signal, and the second PMOST receiving a current output from the first PMOST and establishing the second output signal across the second load in accordance with a fourth bias voltage.

9. The amplifier of claim 3, wherein: the first load comprises a first inductor configured to provide a DC path to a power supply node and the second load comprises a second inductor configured to provide a DC path to a ground node.

10. The amplifier of claim 9 further comprising an output combiner comprising a serial connection of a third inductor magnetically coupled to the first inductor and a fourth inductor magnetically coupled to the second inductor.

11. A method comprising the following steps:
    receiving an input signal;
    transforming the input signal into a first transformed signal of a common-mode voltage equal to a first bias voltage;
    transforming the input signal into a second transformed signal of a common-mode voltage equal to a second bias voltage;
    detecting a peak of the first transformed signal and making the first bias voltage equal to a sum of a first DC (direct current) voltage and a first dynamic voltage approximately proportional to the peak;
    detecting a valley of the second transformed signal and making the second bias voltage equal to a sum of a second DC voltage and a second dynamic voltage approximately proportional to the valley;
    amplifying the first transformed signal into a first output signal across a first load using a N-type cascode amplifier; and
    amplifying the second transformed signal into a second output signal across a second load using a P-type cascode amplifier, wherein the N-type cascode amplifier and the P-type amplifier share a common source node.

12. The method of claim 11, wherein the step of "transforming the input signal into a first transformed signal of a common-mode voltage equal to a first bias voltage" comprises: using a magnetic coupling between a primary coil and a secondary coil to transform the input signal from the primary coil into the first transformed signal on the secondary coil of a center-tap connected to the first bias voltage.

13. The method of claim 11, wherein the step of "transforming the input signal into a second transformed signal of a common-mode voltage equal to a first bias voltage" comprises: using a magnetic coupling between a primary coil and a secondary coil to transform the input signal from the primary coil into the second transformed signal on the secondary coil of a center-tap connected to the second bias voltage.

14. The method of claim 11, wherein the step of "detecting a peak of the first transformed signal and making the first bias voltage equal to a sum of a first DC (direct current) voltage and a first dynamic voltage approximately proportional to the peak" comprises using a N-type dynamic bias circuit comprising: an AC (alternating current) coupling network, a peak detector, a replica peak detector, and an operational amplifier, wherein: the AC coupling network couples the first transformed signal into a coupled signal of a DC voltage equal to a gate voltage, the peak detector comprises a N-type common-mode source follower configured to receive the coupled signal and output the first bias voltage, the replica peak detector comprises a replica N-type common-mode source follower configured to receive the gate voltage and output a replica DC voltage, the operational amplifier outputs the gate voltage in accordance with a difference between the first DC voltage and the replica DC voltage.

15. The method of claim 11, wherein the step of "detecting a valley of the second transformed signal and making the second bias voltage equal to a sum of a second DC voltage and a second dynamic voltage approximately proportional to the valley" comprise using a P-type dynamic bias circuit comprising: an AC (alternating current) coupling network, a valley detector, a replica valley detector, and an operational amplifier, wherein: the AC coupling network couples the second transformed signal into a coupled signal of a DC voltage equal to a gate voltage, the valley detector comprises a P-type common-mode source follower configured to receive the coupled signal and output the second bias voltage, the replica valley detector comprises a replica P-type common-mode source follower configured to receive the gate voltage and output a replica DC voltage, the operational amplifier outputs the gate voltage in accordance with a difference between the second DC voltage and the replica DC voltage.

16. The method of claim 11, wherein the N-type cascode amplifier comprises a cascade of a N-type common-source amplifier comprising a first NMOST (n-channel metal oxide semiconductor field effect transistor) and a N-type common-gate amplifier comprising a second NMOST, the first NMOST receiving the first transformed signal, and the second NMOST receiving a current output from the first NMOST and establishing the first output signal across the first load in accordance with a third bias voltage; and the P-type cascode amplifier comprises a cascade of a P-type common-source amplifier comprising a first PMOST (p-channel metal oxide semiconductor field effect transistor) and a P-type common-gate amplifier comprising a second PMOST, the first PMOST receiving the second transformed signal, and the second PMOST receiving a current output from the first PMOST and establishing the second output signal across the second load in accordance with a fourth bias voltage.

17. The method of claim 16, wherein: the first load comprises a first inductor and the second load comprises a second inductor.

18. The method of claim 17, wherein the first inductor provides a DC path to a power supply node, while the second inductor provides a DC path to a ground node.

19. The method of claim 17 further comprising using an output combiner to combine the first output signal and the second output signal into a combined output signal.

20. The method of claim 19, wherein the output combiner comprises a serial connection of a third inductor magnetically coupled to the first inductor and a fourth inductor magnetically coupled to the second inductor.

* * * * *